(12) United States Patent
Hersman et al.

(10) Patent No.: US 7,769,068 B2
(45) Date of Patent: Aug. 3, 2010

(54) SPECTRAL-NARROWING DIODE LASER ARRAY SYSTEM

(75) Inventors: F. William Hersman, Durham, NH (US); Jan Distelbrink, Peabody, MA (US); Hongguo Zhu, Meriden, CT (US)

(73) Assignee: University of New Hampshire, Durham, NH (US)

( * ) Notice: Subject to any disclaimer, the term of this patent is extended or adjusted under 35 U.S.C. 154(b) by 0 days.

(21) Appl. No.: 11/809,157

(22) Filed: May 31, 2007

(65) Prior Publication Data

US 2007/0297477 A1    Dec. 27, 2007

Related U.S. Application Data

(60) Provisional application No. 60/809,476, filed on May 31, 2006.

(51) Int. Cl.
*H01S 5/00* (2006.01)
(52) U.S. Cl. .................................. 372/50.12
(58) Field of Classification Search ............ 372/50, 372/34–36, 20
See application file for complete search history.

(56) References Cited

U.S. PATENT DOCUMENTS

| | | | |
|---|---|---|---|
| 6,240,116 B1 * | 5/2001 | Lang et al. | 372/50.12 |
| 6,377,599 B1 * | 4/2002 | Marshall | 372/75 |
| 6,584,133 B1 | 6/2003 | Walker et al. | |
| 7,142,569 B2 * | 11/2006 | Chang et al. | 372/20 |

OTHER PUBLICATIONS

H.Zhu, I.C. Ruset and F.W. Hersman,Spectrally narrowed external-cavity high-power stack of laser diode arrays,Optics Letters/vol. 30, No. 11/Jun. 1, 2005, Optical Society of America.

* cited by examiner

*Primary Examiner*—Minsun Harvey
*Assistant Examiner*—Patrick Stafford
(74) *Attorney, Agent, or Firm*—Devine, Millimet & Branch, P.A.; Raymond I. Bruttomesso, Jr.; Paul C. Remus

(57) ABSTRACT

A system to increase the brightness of, and control gaps in, the light from an external cavity, spectrally narrowed, stack of diode laser bars employing a stepped mirror and transparent plates in the external cavity.

9 Claims, 7 Drawing Sheets

SPECTRAL-NARROWING DIODE LASER ARRAY SYSTEM

CROSS-REFERENCE TO RELATED APPLICATIONS

The present application claims the benefit of U.S. Provisional Patent Application Ser. No. 60/809,476 filed May 31, 2006, which is incorporated herein by reference.

GOVERNMENT SPONSORSHIP

This invention was made with government support under Government Contract Nos. EB002553 and ESO14005-01.NIH/NIBIB awarded by the National Institute of Biomedical Imaging and Bioengineering, an institute within NIH, and NIH/NIESH, National Institute of Environmental Health Sciences, an institute within NIH, of the United States Government. The Government has certain rights in the invention.

TECHNICAL FIELD

The present invention relates to diode laser arrays. More specifically, it relates to a system to increase the brightness of, and control gaps in, the light from an external cavity, spectrally narrowed, stack of diode laser bars.

BACKGROUND OF THE INVENTION

Diode lasers provide inexpensive, high-efficiency production of laser light in the near infrared spectrum. This laser light has a number of uses, including optical pumping of alkali metals for spin-exchange optical pumping. However, producing high power output beams with optimal properties from stacks of diode array bars that are well collimated and with uniform intensity has proven challenging.

Single-stripe diode lasers provide a diffraction-limited source with narrow spectral output. Because the source of the light is very small, particularly in one dimension, the light can be collimated with a micro lens, producing a narrow-spectrum, highly collimated beam. In order to achieve the very high powers required for some uses, including optical pumping, many diode stripes 10 are combined onto a single bar 11 as shown in FIG. 1. In order to achieve even higher power, as shown in FIG. 2, several bars 11 are utilized, as a stack, as well. The challenge is both (i) to control all of these stripes so that they lase at the same wavelength, and (ii) to direct the light from the stripes to illuminate a target, such as an optical pumping cell, with uniform intensity without gaps or shadows. In some cases, the optical pumping cell can be quite long, imposing the additional requirement that the light be well collimated.

A bar can have fifty to one hundred stripes, each emitting light out the end. The emission facet then has a surface of one micron by one hundred microns. The emitted light is diverging rapidly along a dimension transverse to the one micron thickness. This spread in emission angles is roughly ±45° at the diffraction limit. This axis is called the "fast axis." The larger hundred micron dimension has an associated transverse divergence in the emission angles of ±10°, along the "slow axis."

One existing method for directing several diode laser stripes toward a single target has been fiber-coupling. A small fiber is attached to each diode laser stripe on a bar (which may contain 20 to 30 stripes) and combined into a single output. These Fiber Array Packages ("FAP's") can then be coupled to an external fiber to deliver the light to the optical pumping cell. When the light emerges from this external fiber, it can be combined with light from other FAPs. It is then passed through a linear polarizing cube, converted from linear to circular using quarter wave plates, and then directed onto the experiment.

The spectral output of these FAPs depends on the distribution of wavelengths of the individual diode laser stripes. Typically, the process can be controlled such that the r.m.s. difference among the wavelengths of light emitted by the stripes tuned to 795 nm is less than two nanometers. This width is not optimal for certain applications, including optical pumping of alkali metals, as the width of the rubidium absorption spectrum is less than one nanometer (in some cases less than one-tenth nanometer (one angstrom)).

Moreover, reference is made to the definition of etendue, the geometric capability of an optical system to transmit radiation. The numeric value of the etendue is a constant of the system (apart from aberrations) and is calculated as the product of the opening size and the solid angle from which the system accepts light. In most practical situations it is approximately the integral over a surface area transmitting the light multiplied by the solid angle into which the light is being transmitted. The etendue of a single diode strip is diffraction limited along the fast axis, but not diffraction limited along the slow axis. The etendue of fiber coupled high power systems is far from diffraction limited. Consequently, the light intensity that can be delivered to a long optical pumping cell is reduced with fiber coupled systems.

BRIEF DESCRIPTION OF THE DRAWINGS

These and other features and advantages of the present invention will be better understood by reading the following detailed description, taken together with the drawings wherein preferred embodiments are shown as follows.

DETAILED DESCRIPTION OF THE INVENTION

Figure 1:
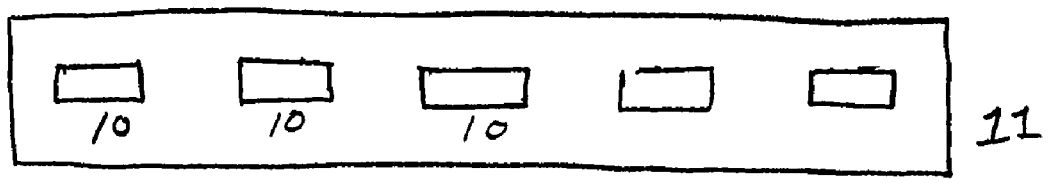
FIG. 1 is a schematic of a diode laser bar with multiple diode laser stripes.
Figure 2:
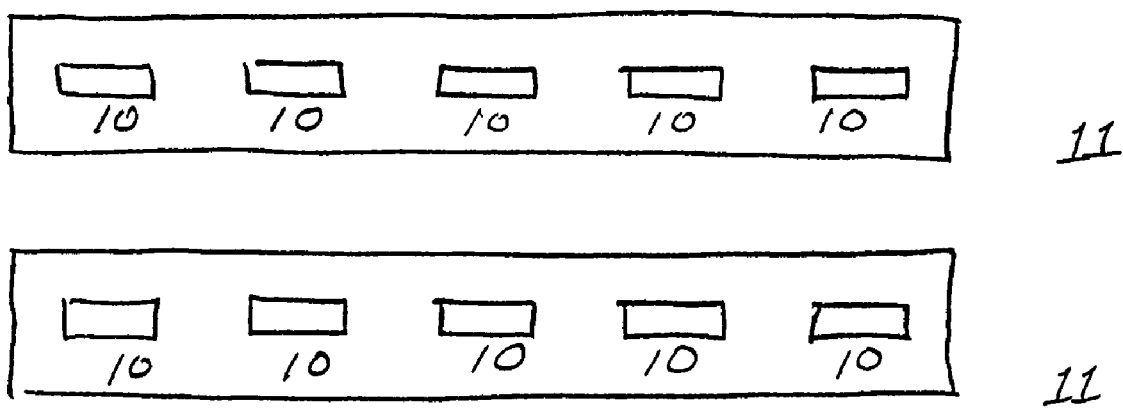
FIG. 2 is a schematic of a stack of the laser bars shown in FIG. 1.

The present invention comprises a system for controlling gaps and correcting path lengths in a spectral-narrowing external cavity diode laser array. Correcting path lengths permits operation closer to the etendue of divergence limit in the "slow axis."

U.S. Pat. No. 6,584,133, the text of which is incorporated herein by reference, describes the use of a wavelength locking technique, which has been previously employed for locking single-stripe diode lasers, on a laser bar. In summary, it employs a pair of converging optical elements, such as lenses or concave mirrors, arranged as a telescope to direct the light from a diode laser bar onto a diffraction grating in a Littrow configuration. The Littrow configuration directs the light of the wavelength of interest directly back along its path. By arranging this "external cavity" with the diffraction grating located at the image spot of the telescope, feedback occurred on only the spectral component of interest at 795 nm with a width of 0.1 nm.

The present invention accomplishes feedback in an external cavity on a plurality of bars, in one embodiment a stack of five bars. The description in U.S. Pat. No. 6,584,133, raised some question as to whether expanding the system described therein to more than one bar would work. Because the focus of the telescope is at a single plane transverse to the optical path, but the diffraction grating is at a steep angle with respect to the optical path, the light from bars not in the center will be diffracted by the grating from a location that is not at the focus of the lenses.

Specifically, the afocal telescope forms a magnified image of the diode laser bars on an image plane in space. A diffraction grating placed at the image plane at the Littrow angle relative to the central axis of the incoming light will diffract a chosen wavelength back along that central axis. Light of the chosen wavelength that was emitted from a point within the laser at some angle with respect to the central axis will arrive at the diffraction grating at the image plane location identical to its emission position (expanded by the magnification), and with that same angle (divided by the magnification). It will depart from the diffraction grating with that same angle, but on the opposite side of the central axis. As it returns to the laser it follows an identical path along the opposite side of the central axis, and returns precisely to its point of emission.

If the diffraction grating is placed at a location other than the image plane of the afocal telescope, light that is incoming along the central axis still diffracts back along its own path. Light that is emitted from some point within the laser emission plane at some angle with respect to the central axis will arrive at the grating with that angle divided by the magnification. In this case, however, a perfect image of the laser is not formed, and the location at which that light hits the grating does not correspond precisely to the point from which it was emitted. After diffraction, the light is reflected at the angle conjugate to its incoming angle, but along a path that is not exactly like the one by which it arrived, but rather offset somewhat, due to the fact that a perfect image was not formed. This light does not arrive back at the laser at the point from which it was emitted, but rather at a different point on the object plane. Indeed, it may arrive back at a point that is not even on the laser face, resulting in inefficiency, heating of the laser surface, and potentially failure.

The prior art also includes suggestions for improvements on the wave length locking technique described in U.S. Pat. No. 6,584,133. Their suggestions include collimating the light and eliminating dark regions, both described in more detail below.

Figure 3:
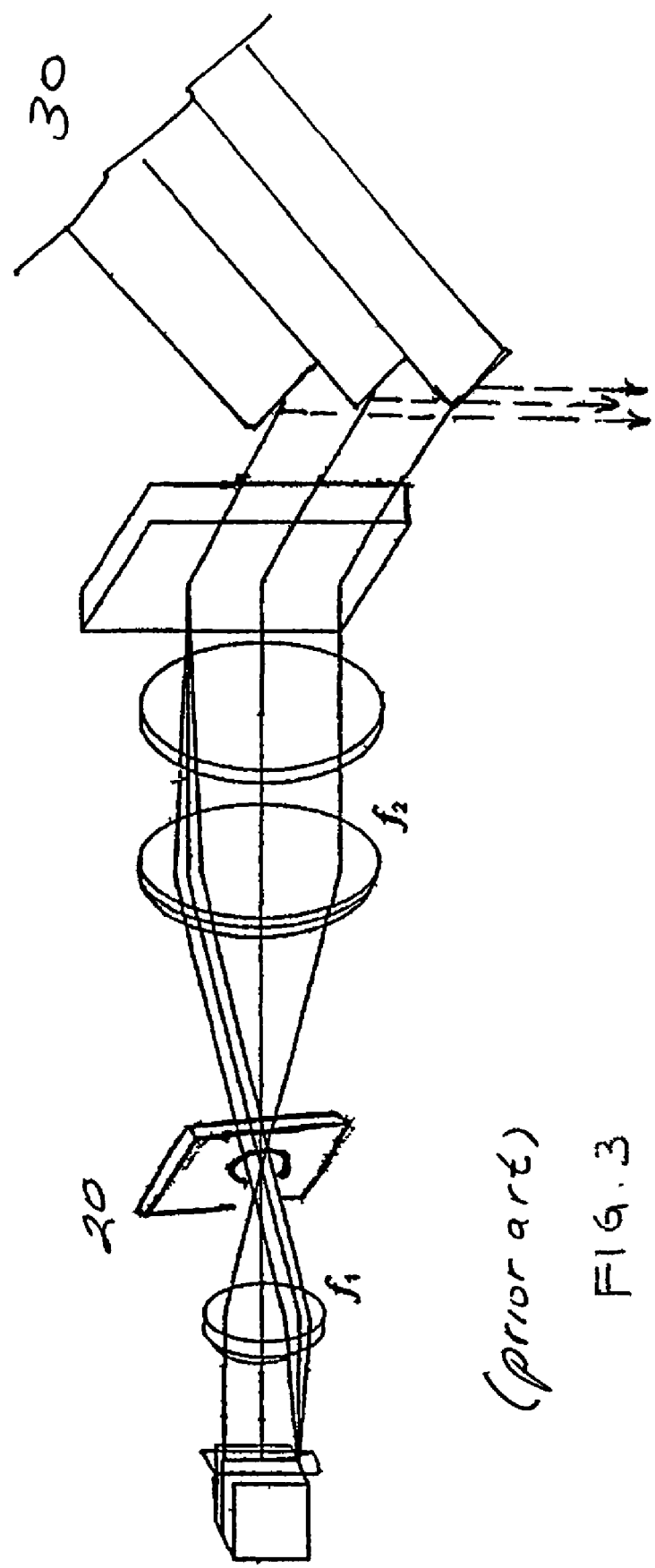
FIG. 3 is a schematic of a wavelength locking technique employed in the prior art employing a collimating aperture.

As shown in FIG. 3, emittance is reduced by collimating the light within the external cavity of the system 30. The telescope optics result in an intermediate focus of all parallel rays distributing all angles of emission transversely across the optical plane at the focus. By collimating the light in the slow-axis direction through the use of an aperture 20 or other equivalent optical device known to those skilled in the art (for example, blocking unwanted rays with a knife edge, preserving desired rays with a narrow mirror or deflecting unwanted rays away with a mirror or prism), amplification of emissions that are off-axis by a particular amount are excluded. Furthermore, the loss in laser output is not reduced by the fraction of the beam that is lost as it would be if the collimation were performed outside the laser cavity. Since off-axis light is not fed back and amplified, all the energy is drained from the laser cavity by emissions that are spectrally correct and directionally correct.

With appropriate collimating, conventional high power diode laser arrays emit light in the form of rectangular light bars separated with fixed pitch distance. The pitch distance varies with lasers and sometimes can be quite large, resulting in a high percentage of dark area in the output laser beam, reducing the laser beam intensity and uniformity, thereby creating problems in many applications. For example, the application of a circularly polarized laser beam in polarizing a noble gas through spin-exchange optical pumping requires high laser beam intensity and uniformity in the gas chamber. To increase the laser beam intensity and uniformity, a stepped mirror, or other equivalent stepped optical devices known to those skilled in the art, can be used outside the external cavity effectively to reduce the dark area in the laser beam with no power loss.

Figure 4:
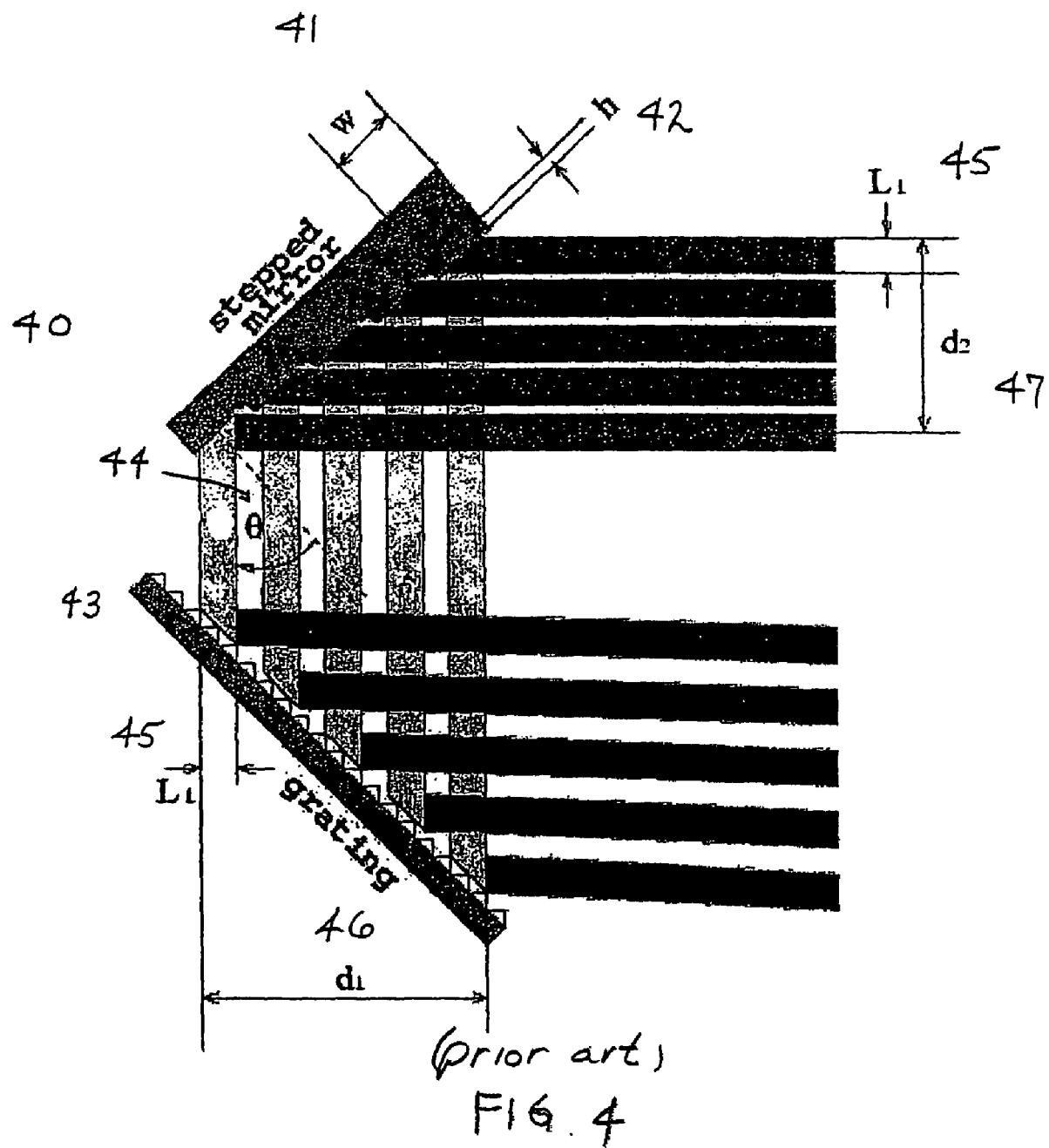
FIG. 4 is a schematic of a stepped mirror outside the external cavity employed in the prior art.

As shown in FIG. 4, a stepped mirror 40 consists of multiple mirror slices with fixed step width (w) 41 that are stacked such that each mirror slice steps up a certain step height (h) 42 sequentially. As shown, the stepped mirror 40 takes the specular reflection or zero order diffraction from a diffraction grating 43 as its input beam. The step width and the step height are chosen to maximize the output beam intensity. They are dependent on the beam incidence angle ($\theta$) 44 on the stepped mirror, the incident light bar width ($L_1$) 45 and the pitch distance. The total width of the incident and output beam are $d_1$ 46 and $d_2$ 47, respectively. It can be shown that the step width (w) 41 and step height (h) 42 are given by the following formula:

$$w = \frac{1}{n}\left(\frac{d_1}{\cos(\theta)} - (n-1)h\tan(\theta)\right),$$

$$h = \frac{d_1 - d_2}{n-1} \frac{\cos(\theta)}{\sin(2\theta)}$$

where n is the total number of light bars. The ratio of the sliced mirror surface that is illuminated by the laser beam ($S_i$) to the total step surface, and the ratio of 'dead' area ($S_d$, area that is blocked due to step height) to the total step surface can be shown as:

$$S_i = \frac{L_1}{nw\cos(\theta)}$$

$$S_d = \frac{h\tan(\theta)}{w}$$

Typically, in a first embodiment, the stepped mirror comprises slices of a mirror supported in a stepped aluminum jig and clamped in place. In a second embodiment, the stepped mirror has an adjustable angle at each step. It comprises slices of mirror adhered to an aluminum jig fashioned such that each attachment surface can be rotated slightly with its own adjustment screw. The reflective surface is a thin narrow facet along the end. In the first embodiment, the coplanarity is achieved by clamping the mirror pieces together. The step displacement and the rotational alignment are maintained by the machined aluminum clamp with steps machined into the inner face. In the second embodiment, the individual mirrors are glued to the fixture individually while monitoring the alignment with a laser, and later adjusted by tightening the screw to produce varying deflections.

Taken together these techniques substantially increase the spectral brightness (intensity per unit wavelength). The divergence along the slow axis can be reduced by a factor of three with almost no loss in power, and another factor of two with approximately 20% loss in power. The gaps between the bars can be almost eliminated, bringing the separation between bright lines closer by a factor of two, and resulting in a beam of very high uniformity (after allowing the individual lines to spread out due to their own divergence or with a very narrow angle diffuser).

Figure 5:
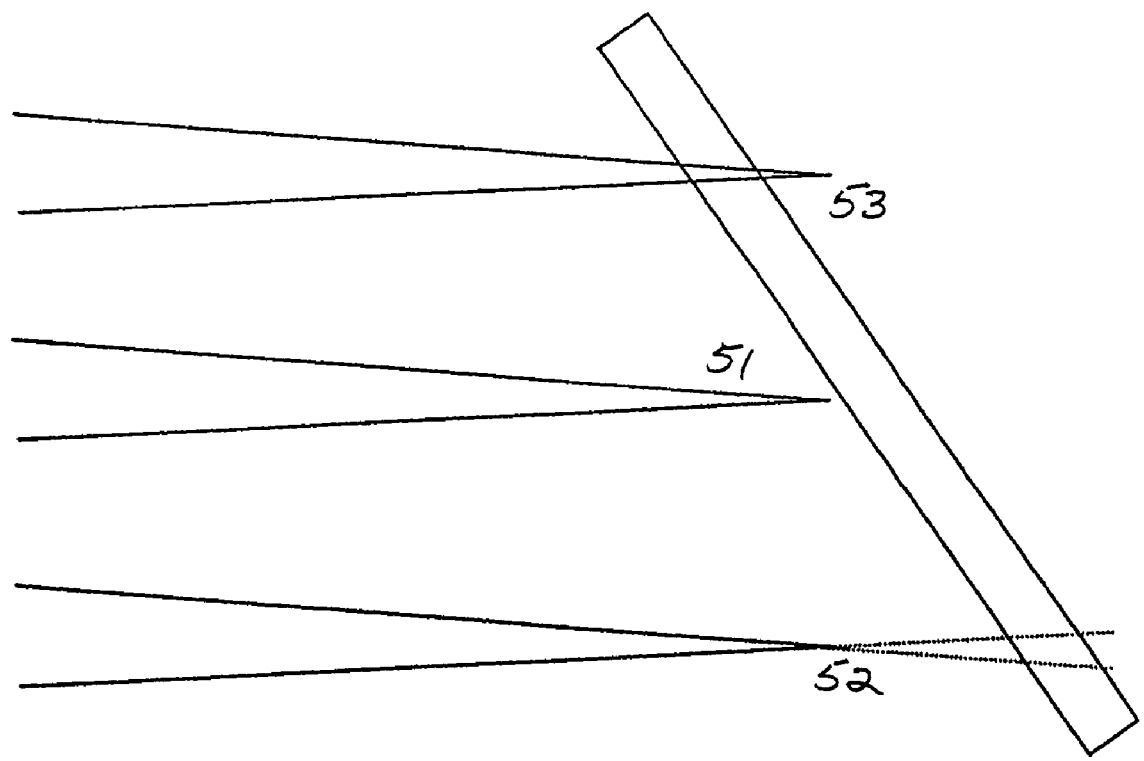
FIG. 5 is a schematic of a stack of three laser bars being imaged in front of, on, and past the surface of a diffraction grating.

The system of the present invention provides further improvement by correcting optical path lengths and inserting the stepped mirror inside the external cavity, both as described in more detail below. If one is creating an external cavity for a single laser bar, the distance between that bar and its image can be precisely the distance to the image plane of the afocal telescope. If, however, the goal is to provide an external cavity for several laser bars in a stack, one is faced with choices or compromises: one can choose a planar element at the far end of the external cavity, such as an element whose reflectivity is frequency dependent, for example, an etalon or prism or other optical devices known to those skilled in the art. However, if the choice is to use a diffraction grating, then the grating must be placed at an angle relative to the central axis of the cavity, and only one of the laser bars 51 can be perfectly imaged, the other bars being imaged in front of 52 or past 53 the surface of the diffraction grating, as shown in FIG. 5.

One solution is to provide one small diffraction grating for each set of light rays corresponding to the emissions from each diode laser bar. This solution suffers from high cost. It also suffers because the grating from one bar will prevent light from emerging from the adjacent grating. The system of the present invention provides a simple, cost-effective method to image each of the laser bars on the diffraction grating.

Figure 6:
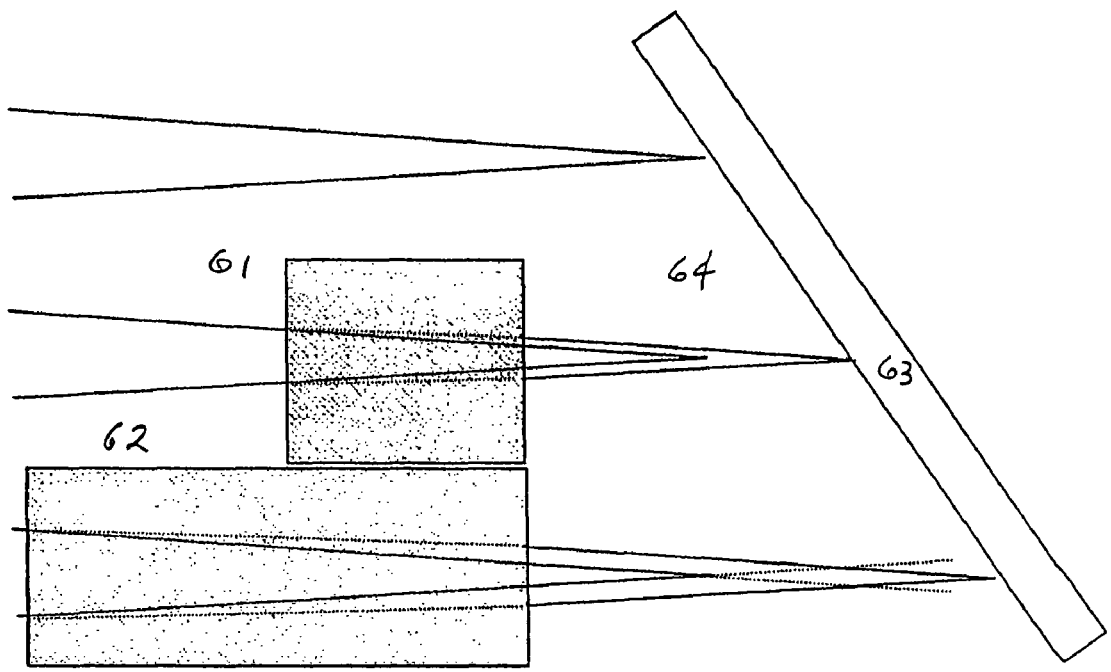
FIG. 6 is a schematic of the use of glass blocks in an embodiment of the present invention for imaging the laser bars of FIG. 5 on the surface of a diffraction grating.

It comprises in a preferred embodiment a set of glass plates or blocks, 61, 62 inside the external cavity, inserted into the paths of the separate laser bar emissions as shown in FIG. 6. The optical path of light from each laser bar will pass through a different thickness of glass. It is to be understood that the preferred embodiment employs glass plates but plates of any suitable transparent material may be substituted. Converging light passing through a thickness of material with a greater index of refraction will focus at a further distance 63 than it would without the glass present 64. The change in the focus Δ, the difference between distance 63 and distance 64, caused by insertion (into a medium whose index of refraction is unity) of a glass plate with index of refraction n, whose thickness is t follows the equation:

$$\Delta = t\left(1 - \frac{1}{n}\right)$$

Figure 7:
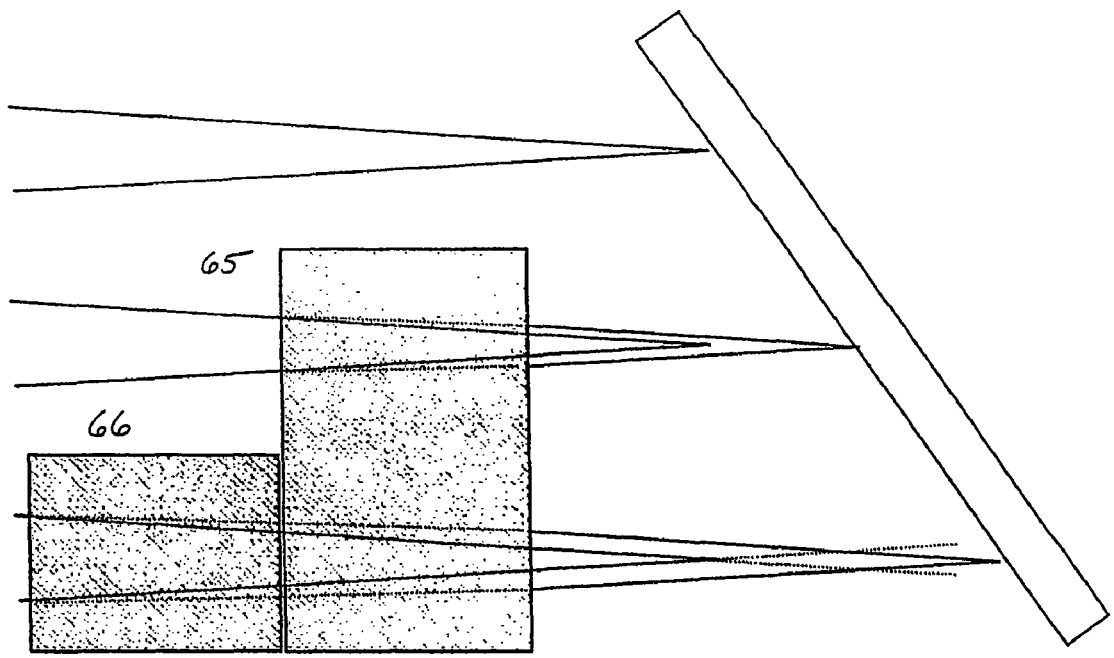
FIG. 7 is a schematic of the use of glass blocks in another embodiment of the present invention for imaging laser bars on the surface of a diffraction grating.

As shown in FIGS. 6 and 7, the glass plates 61, 62 and 65, 66 can assume different orientations and configurations. They can be oriented along the light rays or perpendicular to them, the different configurations, nevertheless, achieving the same result.

Figure 8:
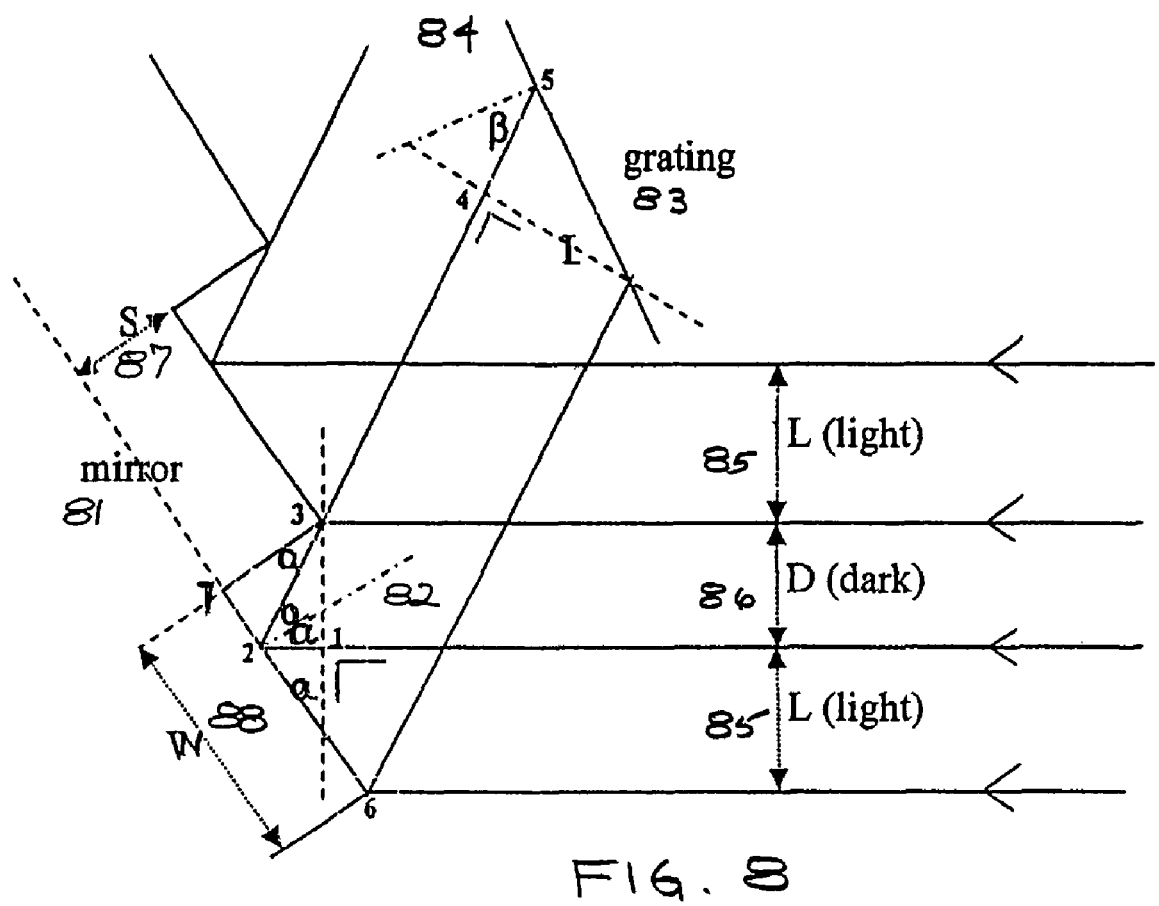
FIG. 8 is a schematic of the geometry of a stepped mirror in the external cavity of a preferred embodiment of the present invention.

Another preferred embodiment of the present invention eliminates dark regions and simultaneously corrects path length differences between the laser bars and the angled diffraction grating by inserting a stepped mirror inside the external cavity. FIG. 8 shows the geometry of the embodiment, in which the slow axis foci is in the plane of the diffraction grating.

Light enters as shown, reflects off the stepped mirror 81 (angle of incidence α 82), and then off the diffraction grating 83 (Littrow angle 84 β=46.662 degrees for 1800 lines/mm & 794.7 nm). Incoming parallel beams of width L 85 are separated by a darkspace D 86.

The stepheight S 87 of the stepped mirror 81 is selected such that the darkspace is eliminated from the reflected beam (as shown in FIG. 8): Lightpath 2-3 equals D/sin 2α. Thus S=D(cos α/sin 2α).

The stepwidth W 88 of the stepped mirror is then equal to the sum of line segments 6-2 and 2-7: L/cos α+S tan α.

Thus, angle α can be chosen such that the light paths to the grating are the same length for every beam. This way each beam can be focused on the grating (slow axis (not shown), perpendicular to the plane of drawing).

This is accomplished when the lightpath 1-2-3 is the same as lightpath 4-5.

Angle 1-2-3 equals 2α.

Thus lightpath 1-2-3 equals D(1/tan 2α+1/sin 2α).

Lightpath 4-5 equals L cotan(90−β)=L tan β.

Setting the paths equal to each other gives L/D=(1/tan 2α+1/sin 2α)/tan β, which holds for α<=45 degrees. A more involved derivation, known to those skilled in the art, can be provided for angles of incidence larger than 45 degrees producing the same result.

A preferred embodiment of the stepped mirror provides for the attachment of the reflecting mirrored surface onto a mechanical support that allows for small adjustments to the angle α for each of the individual mirrors. Manufacturing tolerances in the placement of the microlenses in front of each diode bar in the stack can result in bar-to-bar differences in the propagation direction of the fast-axis collimated beam. These bar-to-bar differences can cause two problems: 1) differences in the propagation direction result in different wavelengths selected by the Littrow configuration of the grating; and 2) differences in the propagation direction will result in regions in the output beam of greater intensity (as the output of two bars overlap) and lesser intensity (as gaps open up between bars). Adjustments of the deflection angles of the individual steps in the step mirror will eliminate bar to bar differences in spectral wavelength, improving the spectral brightness of the combined beam, and improve the uniformity in the output beam.

Figure 9:
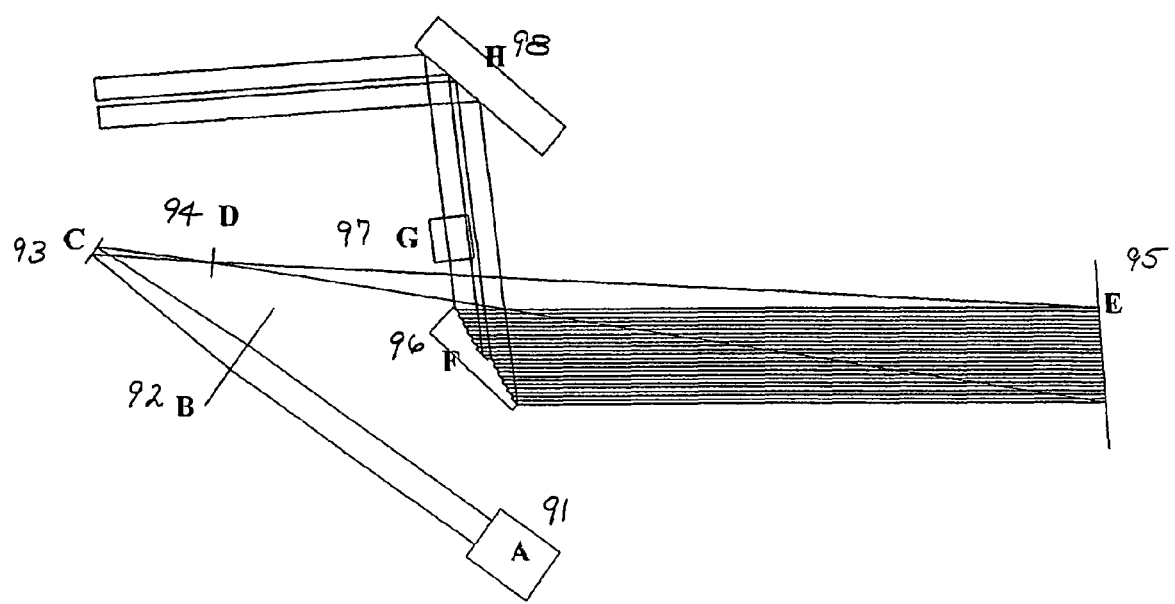
FIG. 9 is a schematic of an embodiment of the present invention comprising both a glass block and a stepped mirror, both in the external cavity.

Another preferred embodiment of the present invention is shown in FIG. 9. It combines the elements of the present invention identified above. As shown in FIG. 9, it comprises the following:

A. 12 Bar Laser 91;
B. 2" Positive Achromatic lens 92;
C. Plane 1" di-electric mirror 93;
D. Beam Collimator 94;
E. 6" di-electric parabolic mirror 95;
F. Stepped Mirror 96;
G. Glass block 97; and
H. Grating 98.

Laser A 91 consists of 12 bars oriented vertically, treated here as two groups of six. Within each group of six, the stepped mirror 96 is able to eliminate dark spaces between the bars as well as readjust the path lengths from the source to the diffraction grating, as described in more detail above.

The afocal telescope elements are B the positive achromatic lens 92 and E the parabolic mirror 95. The angle of the optical path C-E-F is minimized in order to minimize off-axis aberrations at the parabolic mirror 95.

The second group of six laser bars has an offset from the first group. This physical separation allows an intentional dark area in the final beam, which can be useful in certain applications. Because this separation changes the physical path length from the laser to the diffraction grating, the rays would no longer focus at the grating and return focused on the laser if there were no correction. The glass block G inside the external cavity extends the focal point of the second group of six bars, so that they focus on the grating.

Stepped mirrors can eliminate dark regions between laser bars as well as change the focal distance of the rays to the grating. Glass blocks can change the focal distance of the grating. A combination of stepped mirrors and glass blocks can allow versatile variations of dark regions, and still accomplish focusing each bar on the grating.

While the principles of the present invention have been described herein, it is to be understood by those skilled in the art that this description is made only by way of example and not as a limitation as to the scope of the present invention. Other embodiments are contemplated within the scope of the present invention in addition to the exemplary embodiments shown and described herein. Modifications and substitutions by one of ordinary skill in the art are considered to be within the scope of the present invention.

What is claimed is:

1. A system for wavelength selection and spectral narrowing of a diode laser array comprising:
   the diode laser having a plurality of laser bars, each bar having a plurality of diode strips;
   a grating;
   an external cavity between the diode laser and the grating; and
   a stepped mirror inside the external cavity for correcting the optical path length difference between different laser bars and the grating in order to allow each laser bar to focus.

2. The system of claim 1 wherein the stepped mirror has an adjustable angle at each step.

3. A system for wavelength selection and spectral narrowing of a diode laser array comprising:
   the diode laser having a plurality of laser bars;
   an external cavity between the diode laser and the grating; and
   a stepped mirror and one or more transparent plates are inside the external cavity, wherein the stepped mirror and the one or more transparent plates has a specific thickness for changing the focus of the plurality of laser bars for correcting the path length difference between different laser bars and the grating in order to allow each laser bar to focus.

4. The system of claim 3 wherein the one or more transparent plates are glass plates.

5. A system for wavelength selection and spectral narrowing of a diode laser array comprising:
   the diode laser having a plurality of laser bars, each bar having a plurality of diode strips;
   a grating;
   an external cavity between the diode laser and the grating;
   a stepped mirror inside the external cavity for correcting the optical path length difference between different laser bars and the grating in order to allow each laser bar to focus, and
   one or more transparent plates inside the external cavity.

6. A method for wavelength selection and spectral narrowing of a diode laser array with a plurality of laser bars and with an external cavity, comprising:
   inserting a stepped mirror inside the external cavity defined by the diode laser and the grating for correcting the path length difference between different laser bars and the single grating in order to allow each laser bar to focus by disrupting the equality of the optical distance from the laser bar by the amount that the grating extends the path, and
   inserting one or more transparent plates inside the external cavity for correcting the optical path length difference.

7. The method of claim 6 wherein the stepped mirror has an adjustable angle at each step.

8. The method of claim 5 wherein the transparent plates are glass plates.

9. A system for wavelength selection and spectral narrowing of a diode laser array comprising:
   the diode laser array has at least two bars having a plurality of diode stripes;
   a single grating;
   an external cavity defined by the diode laser and the grating;
   a stepped mirror inside the external cavity, the stepped mirror having a plurality of steps with an adjustable angle at each step for correcting the path length difference between different laser bars and the single grating in order to allow each laser bar to focus;
   a pair of afocal telescope elements inside the external cavity and interposed between the diode laser and the step mirror; and
   one or more transparent plates inside the external cavity, wherein each of the one or more transparent plates has a specific thickness for changing the focus of the plurality of laser bars.

* * * * *